United States Patent [19]

Sun et al.

[11] Patent Number: 5,880,040
[45] Date of Patent: Mar. 9, 1999

[54] GATE DIELECTRIC BASED ON OXYNITRIDE GROWN IN $N_2O$ AND ANNEALED IN NO

[75] Inventors: Shi-Chung Sun, Hsinchu; Chun-Hon Chen, Lung-Jing Village; Lee-Wei Yen; Chun-Jung Lin, both of Hsin-Tien, all of Taiwan

[73] Assignee: Macronix International Co., Ltd., Taiwan

[21] Appl. No.: 632,178

[22] Filed: Apr. 15, 1996

[51] Int. Cl.[6] .................................................. H01L 21/316
[52] U.S. Cl. ............................................................. 438/769
[58] Field of Search ........................... 437/239; 438/770, 438/771, 769, 775, 776

[56] References Cited

U.S. PATENT DOCUMENTS

| | | | |
|---|---|---|---|
| 5,198,392 | 3/1993 | Fukuda et al. | 437/241 |
| 5,264,396 | 11/1993 | Thakur et al. | 437/242 |
| 5,397,720 | 3/1995 | Kwong et al. | 437/239 |
| 5,407,870 | 4/1995 | Okada et al. | 437/241 |
| 5,591,681 | 1/1997 | Wristers et al. | 437/240 |
| 5,631,199 | 5/1997 | Park | 438/770 |

OTHER PUBLICATIONS

Wolf, Stanley and Richard Tauber, *Silicon Processing For The VLSI ERA*, vol. 1; pp. 198–199, 221–223, (1986).

Bhat, et al., "MOS Characteristics Of Ultrathin NO–Grown Oxynitrides", *IEEE Electron Device Letters*, vol. 15, No. 10, pp. 421–423, Oct. 1994.

Bhat, et al., "Performance And Hot–Carrier Reliability Of N–And P–MOSFETs with Rapid Thermally NO–nitrided $SiO_2$ Gate Dielectrics", *IEDM Technical Digest*, pp. 329–332, (1994).

Fukuda, et al., "Highly Reliable Thin Nitrided $SiO_2$ Films Formed By Rapid Thermal Processing In An $N_2O$ Ambient", *Electronics Letters*, vol. 26, No. 18, pp. 1505–1506, Aug. 1990.

Green, et al., "Rapid Thermal Oxidation Of Silicon $N_2O$ Between 800 And 1200° C.: Incorporated Nitrogen And Interfacial Roughness", *Appl. Phy. Lett.*, vol. 65, No. 7, pp. 848–850, Aug. 1994.

Harrison, et al., "Dielectrics On Silicon Thermally Grown Or Annealed In A Nitrogen Rich Environment ", *Materials Research Society Symposium Proceedings*, vol. 342, pp. 151–161, Apr. 1994.

Hori, "Inversion Layer Mobility Under High Normal Field In Nitrided–Oxide MOSFET's", *IEEE Transactions On Electron Devices*, vol. 37, No. 9, pp. 2058–2069, Sep. 1990.

Ting, et al., "Composition And Growth Kinetics Of Ultrathin $SiO_2$ Films Formed By Oxidizing Si Substrates In $N_2O$", *Appl. Phys. Lett.*, vol. 57, No. 26, pp. 2808–2810, Dec. 1990.

Joshi, et al., "Oxynitride Gate Dielectrics For $p^+$–Polysilicon Gate MOS Devices", *IEEE Electron Devices Letters*, vol. 14, No. 12, pp. 560–562, Dec. 1993.

Naruke, et al., "Stress Induced Leakage Current Limiting To Scale Down Eeprom Tunnel Oxide Thickness", *IEDM Technical Digest*, pp. 424–427, Dec. 1988.

Okada, et al., "Furnace Grown Gate Oxynitride Using Nitric Oxide (NO)", *IEEE Transactions On Electron Devices*, vol. 41, No. 9, pp. 1608–1613, Sep. 1994.

(List continued on next page.)

*Primary Examiner*—Charles L. Bowers, Jr.
*Assistant Examiner*—Matthew Whipple
*Attorney, Agent, or Firm*—Wilson Sonsini Goodrich & Rosati; Mark A. Haynes

[57] ABSTRACT

A new technique for the formation of high quality ultrathin gate dielectrics is proposed. Gate oxynitride was first grown in $N_2O$ and then annealed by in-situ rapid thermal NO-nitridation. This approach has the advantage of providing a tighter nitrogen distribution and a higher nitrogen accumulation at or near the Si—$SiO_2$ interface than either $N_2O$ oxynitride or nitridation of $SiO_2$ in the NO ambient. It is applicable to a wide range of oxide thickness because the initial rapid thermal $N_2O$ oxidation rate is slow but not as self-limited as NO oxidation. The resulting gate dielectrics have reduced charge trapping, lower stress-induced leakage current and significant resistance to interface state generation under electrical stress.

26 Claims, 10 Drawing Sheets

OTHER PUBLICATIONS

Okada, et al., "Gate Oxynitride Grown In Nitric Oxide (NO)", *Symposium On VLSI Technology Digest Of Technical Papers*, pp. 105–106, (1994).

Sun, et al., "Characterization And Optimization Of NO–Nitrided Gate Oxide By RTP", *IEDM Technical Digest*, pp. 687–690, Dec. 1995.

Sun, et al., "Gate Oxynitride Growth In $N_2O$ And Annealed In NO Using Rapid Thermal Processing", *Mat. Res. Soc. Symp. Proc.*, vol. 387, pp. 241–246, (1995).

Tang, et al., "Nitrogen Content Of Oxynitride Films On Si(100)", *Appl. Phys. Lett.*, vol. 64, No. 25, pp. 3473–3475, Jun. 1994.

Ting, et al., "Composition And Growth Kinetics Of Ultrathin $SiO_2$ Films Formed By Oxidizing Si Substrates In $N_2O$", *Appl. Phys. Lett.*, vol. 57, No. 26, pp. 2808–2810, Dec. 1990.

Tobin, et al., "Silicon Oxynitride Formation In Nitrous Oxide ($N_2O$): The Role Of Nitric Oxide (NO)", *Symposium On VLSI Technlogy Digest Of Technical Papers*, pp. 51–52, May 1993.

Yao, et al., "High Quality Ultrathin Dielectric Films Grown On Silicon In A Nitric Oxide Ambient", *Appl. Phys. Lett.*, vol. 64, No. 26, pp. 3584–3586, Jun. 1994.

Yao, et al., "The Electrical Properties Of Sub–5–nm Oxynitride Dielectrics Prepared In A Nitric Oxide Ambient Using Rapid Thermal Processing", *IEEE Electron Device Letters*, Vo. 15, No. 12, pp. 516–518, Dec. 1994.

FILM THICKNESS INCREASE OF OXIDE AFTER REOXIDATION OF CONTROL OXIDE, $N_2O$, $O_2$+ NO AND $N_2O$ + NO OXYNITRIDES AT 900° C IN $O_2$ FURNACE.

FIG.-5

CHARGE TRAPPING CHARACTERISTICS IN MOS CAPACITORS UNDER CONSTANT CURRENT STRESS.

FIG.-6

INTERFACE STATE GENERATION AS A FUNCTION OF INJECTED CHARGE.

J-E CHARACTERISTICS OF MOS CAPACITERS BEFORE AND AFTER CHARGE INJECTION STRESS.

FIG. -8

EFFECTIVE ELECTRON MOBILITY vs. EFFECTIVE ELECTRIC FIELD
25μm x 25μm NMOSFETs WITH $O_2$ OXIDE, $N_2O$,
$O_2$ + NO AND $N_2O$ + NO OXYNITRIDES GATE DIELECTRICS.

FIG.−9

HIGH-FREQUENCY C-V CURVES OF $BF_2$-IMPLANTED POLY-Si GATE CAPACITORS AFTER 900°C/30 min ANNEALING IN $N_2$.

FIG.—10

GATE DIELECTRIC BASED ON OXYNITRIDE GROWN IN $N_2O$ AND ANNEALED IN NO

BACKGROUND OF THE INVENTION

1. Field of the Invention

The present invention relates to processes for manufacturing dielectric films for use in semiconductor devices; and more particularly to nitrogen containing silicon dioxide ($SiO_2$) dielectric films.

2. Description of Related Art

High quality dielectric films have been made in the prior art by thermal nitridation of thin $SiO_2$ films, resulting in nitrogen containing $SiO_2$, known as oxynitride and also known as nitrided $SiO_2$, having improved dielectric integrity, relieved strain and stress associated with volume expansion of $SiO_2$, and hot-carrier reliability due to the incorporation of nitrogen at the Si—$SiO_2$ interface, as compared to conventional thermal $SiO_2$. Rapid thermal oxidation of Si in $N_2O$ has been studied as a good way to incorporate nitrogen in a gate $SiO_2$ dielectric due to process simplicity and the absence of simultaneous incorporation of hydrogen. See, Green, et al., Appl. Phys. Lett., 65, 848 (1994), Tang, et al., Appl. Phys. Lett., 64, 3473 (1994), Hwang, et al., Appl. Phys. Lett., 57, 3 (1990) and Fukuda, et al., Electron Lett., 26, 1505 (1990). However, $N_2O$-based oxynitrides incorporate such low levels of nitrogen in the films, that the resulting films may not be able to prevent boron penetration or other problems. See, Joshi, et al., IEEE Electron Dev. Lett., 14, 560 (1993).

An earlier study of an $N_2O$ furnace based oxynitridation process focusing on the vapor phase reactions, concluded that nitric oxide (NO) is the critical species responsible for nitridation in the $N_2O$ oxynitride process. See, Tobin, et al., Dig. Tech. Papers, 1993 Symp. of VLSI Technol., 51 (1993). Nitridation of $SiO_2$ with NO in a conventional furnace environment indeed has been found to provide a higher nitrogen content at the Si—$SiO_2$ interface. See, Okada, et al., IEEE Trans. Electron Devices, 41, 1608 (1994) and Okada, Dig. Tech. Papers, 1994 Symp. of VLSI Technol., 105 (1994). Recent reports on the rapid thermal technique demonstrate the advantages obtained with NO nitridation while simultaneously maintaining a low thermal budget. See, Harrison, et al., MRS Symposia Proceedings, 342, 151 (1994), Yao, et al., Appl. Phys. Lett., 64, 3584 (1994), Bhar, et al., IEDM Tech. Dig., 329 (1994), Bhat J., et al., IEEE Electron Dev. Lett., 15 421 (1994).

Direct oxidation in a pure NO ambient is, however, highly self-limited due to the strong Si—N bond and high nitrogen concentration in the NO-grown films. For example, in one experiment NO oxidation at 1100° C., the oxide thickness was only 3.8 nm after 180 seconds. To alleviate this limitation, several two-step processes in which an initial oxide was grown in $O_2$, and then annealed in NO were proposed for oxide thicknesses exceeding 5 nm. See, Okada, et al., IEEE Trans. Electron Devices, 41, 1608 (1994) and Bhat, et al., IEEE Electron Dev. Lett., 15 421 (1994).

SUMMARY OF THE INVENTION

The present invention provides for growing a gate oxynitride in an $N_2O$ environment, instead of an $O_2$ environment as used in the prior art, and then annealing the oxynitride layer in an NO environment. MOS capacitors and MOSFET's with gate oxynitride according to the present invention are provided with improved characteristics compared to those manufactured using conventional techniques.

Thus, the present invention can be characterized as a method for manufacturing a dielectric layer on a silicon substrate comprising a first step of heating a surface of the silicon substrate and exposing the heated surface of the silicon substrate to a first gas comprising $N_2O$ to cause growth of a layer of $SiO_2$ on the surface, which incorporates a concentration of nitrogen in the layer. Next, the layer of $SiO_2$ is heated and exposed to a second gas comprising NO to cause formation of silicon-to-nitrogen bonds in an interfacial region between the layer of $SiO_2$ and the silicon substrate. Finally, the completed layer is annealed in the presence of an inert gas such as nitrogen. In a preferred embodiment, the resulting layer of $SiO_2$ has a concentration of about 0.1% to 0.7% and preferably about 0.4% to 0.6% nitrogen by atomic weight incorporated into the layer. In the interfacial region between the $SiO_2$ and the silicon substrate, a concentration of about 1% to 7% and about preferably 4% to 5% of nitrogen by atomic weight is formed. This results in an oxynitride dielectric layer having significantly better performance characteristics than prior art approaches.

According to one aspect of the invention, the manufacturing method is accomplished with an in-situ rapid thermal process. Thus according to this aspect of the invention, the method includes placing the silicon substrate in a rapid thermal process chamber, filling the process chamber with the first gas comprising $N_2O$, heating the surface of the silicon substrate to a first reaction temperature, and after a first reaction time cooling the silicon substrate. Next, the first gas is removed from the process chamber and the process chamber is filled with the second gas comprising NO. The silicon dioxide layer is heated to a second reaction temperature and after a second reaction time the silicon substrate is cooled. Finally, the second gas is removed from the chamber and an inert gas is moved into the chamber. Then the silicon substrate is heated to an annealing temperature.

The processes according to the present invention are particularly suited to manufacturing dielectric layers having a thickness of less than 12 nanometers (nm), and more specifically between 2.5 and 10 nm. The preferred embodiment of the present invention has a thickness of between 4 and 8 nm for use in MOS devices having deep sub-micron critical dimensions, and in other small semiconductor structures.

The present invention can also be characterized as a dielectric on a silicon substrate comprising a layer of $SiO_2$ having thickness of between about 2.5 and 10 nm, and incorporating nitrogen in a concentration of between about 0.1% and 0.7% by atomic weight. An interfacial region between the layer of $SiO_2$ and the silicon substrate includes nitrogen having a concentration of between about 1% and 7% by atomic weight.

Using the dielectric according to the present invention, dual gate CMOS transistors are particularly improved. Thus, the present invention can also be characterized as a dual gate CMOS integrated circuit comprising a silicon substrate having a p-type well and an n-type well, and a dielectric as discussed above formed on the silicon substrate. An n+ doped polysilicon gate is formed over the dielectric over then n-type well, and a p+ doped polysilicon gate is formed over the dielectric over the p-type well. Using the p+ doped polysilicon gate over the dielectric creates the possibility of boron penetration. However, the dielectric of the present invention, retards boron penetration substantially, because of the nitrogen in the $SiO_2$ layer and at the interfacial region.

Accordingly, the present invention provides formation of a dielectric oxynitride grown in an $N_2O$ environment and annealed in an NO environment. The resulting dielectrics exhibit excellent reliability and immunity to boron penetration, making this technology very promising for deep-submicron dual-gate CMOS technology, and for other small dimension dielectric applications.

Other aspects and advantages of the present invention can be seen upon review of the figures, the detailed description, and the claims which follow.

DETAILED DESCRIPTION

Figures 1, 2:
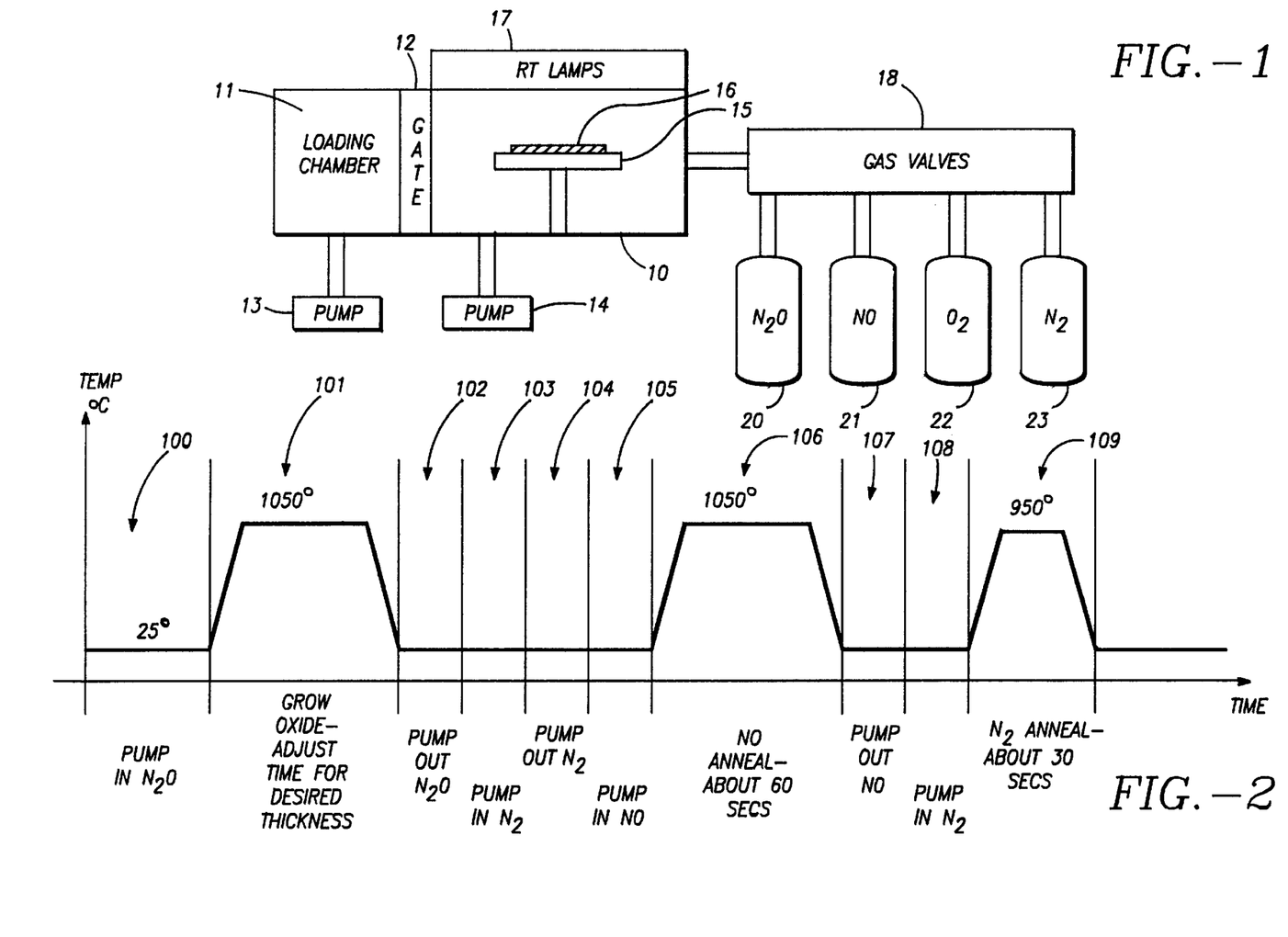
FIG. 1 is a schematic diagram of a rapid thermal process chamber used for implementing the present invention.
FIG. 2 is a diagram illustrating a preferred process sequence using the rapid thermal processor of FIG. 1 for implementing the dielectric of the present invention.

FIG. 1 illustrates a process chamber utilized for the purposes of forming dielectrics according to the present invention. Thus, in FIG. 1, a rapid thermal process chamber 10 is coupled to a loading chamber 11 through a vacuum gate 12. Separate vacuum pumps 13 and 14 are coupled to the loading chamber 11 and the process chamber 10, respectively. Process chamber 10 includes a wafer pedestal 15 on which a wafer 16 is placed during the process. The rapid thermal process chamber 10 includes rapid thermal lamps 17 or other heating technology for the purpose of heating the surface of the wafer 16 during processing. Gas sources are coupled to the rapid thermal chamber 10 using gas valves 18. The gas sources include a source 20 of pure $N_2O$ (99.999%), a source 21 of pure NO (99.9%), a source 22 of pure $O_2$ and a source 23 of pure $N_2$ which are selectively supplied into the chamber 10 through mass flow controllers for the purpose of inducing the reactions described below according to the present invention. Pressure is controlled in the chamber using a variable orifice butterfly valve in the exhaust path (not shown) and inlet gas flow rates.

The present invention can also be carried out using more conventional reaction ovens. However, because of the toxicity of NO gas, and of advantages of the rapid thermal processing technologies, the preferred system is based on a rapid thermal process chamber, such as the load locked AET Rapid Thermal Processor, conunercially available through AET of Milpitas, Calif. A wide variety of other rapid thermal process chambers are also suitable for use according to the present invention.

FIG. 2 illustrates the process carried out according to the present invention for the purposes of growing a dielectric with improved characteristics. In FIG. 2, the vertical axis shows temperature of the surface of the silicon wafer 16 in degrees Celsius. The process steps executed over time are set out along the horizontal axis. Thus as can be seen in FIG. 2, in a first step during interval 100, the silicon wafer is at about room temperature or 25° C., and $N_2O$ gas is pumped into the process chamber 10 at a low base pressure of $1 \times 10^{-5}$ torr until the process chamber pressure reaches atmospheric pressure (about 760 torr).

During interval 101 of FIG. 2, the wafer is rapidly heated to a reaction temperature in the range of 900° to 1200° C., and in this example about 1050° C. The time to heat the silicon surface from room temperature to the reaction temperature is in the neighborhood of 5 to 6 seconds in a typical rapid thermal process. For $N_2O$ gas at near atmospheric pressure, oxide is grown for a period of 30 to 90 seconds with the wafer at the reaction temperature, and, for example, about 60 seconds. However, the process time is adjusted according to the pressure of the $N_2O$ gas, the desired thickness of the dielectric layer, and the quality of the dielectric to be grown. It is found that lower pressures, such as for example about 40 torr of $N_2O$, result in improved thickness uniformity of the oxide layer, at the cost of longer reaction times. See for example S.C. Sun, et al. "Rapid Thermal Oxidation of Lightly Doped Silicon in $N_2O$", Vol. 342, MRS Symposia Proceedings (1994). Next, the temperature of the wafer is brought back down to near room temperature. The time required to lower the temperature from the reaction temperature to near room temperature ranges from 15 to 30 seconds in a typical rapid thermal chamber.

During interval 102, the $N_2O$ is pumped out of the reaction chamber 10. The reaction chamber is then filled with nitrogen in interval 103. Then the nitrogen is removed in interval 104 to flush the chamber. In interval 105, NO gas is pumped into the chamber. Again, NO gas is pumped in at low base pressure until process chamber reaches the atmospheric pressure in the preferred system. Next, during interval 106, the surface of the silicon wafer is heated to a reaction temperature in the range of 900° to 1200° C., and in a preferred embodiment about 1050° C. The silicon wafer is then annealed in the presence of NO gas for a reaction time of about 60 seconds, and the temperature is brought back down to near room temperature. During the NO anneal of interval 106, NO diffuses through the oxide layer grown in the interval 101, and reacts with the silicon substrate to form silicon-to-nitrogen bonds in the interfacial region. The reaction time is adjusted according to the thickness of the oxide layer, the desired concentration of silicon-to-nitrogen bonds, the reaction temperature, and other parameters of the NO anneal step.

During interval 107, the NO gas is pumped out of the chamber. The chamber is flushed with nitrogen during interval 108. During interval 109, the surface of the silicon wafer is heated to about 950°, in the presence of nitrogen or another inert gas, to anneal the resulting structure for about 30 seconds. The temperature of the wafer is then moved back to room temperature, and the process is complete during interval 110.

Figure 3:
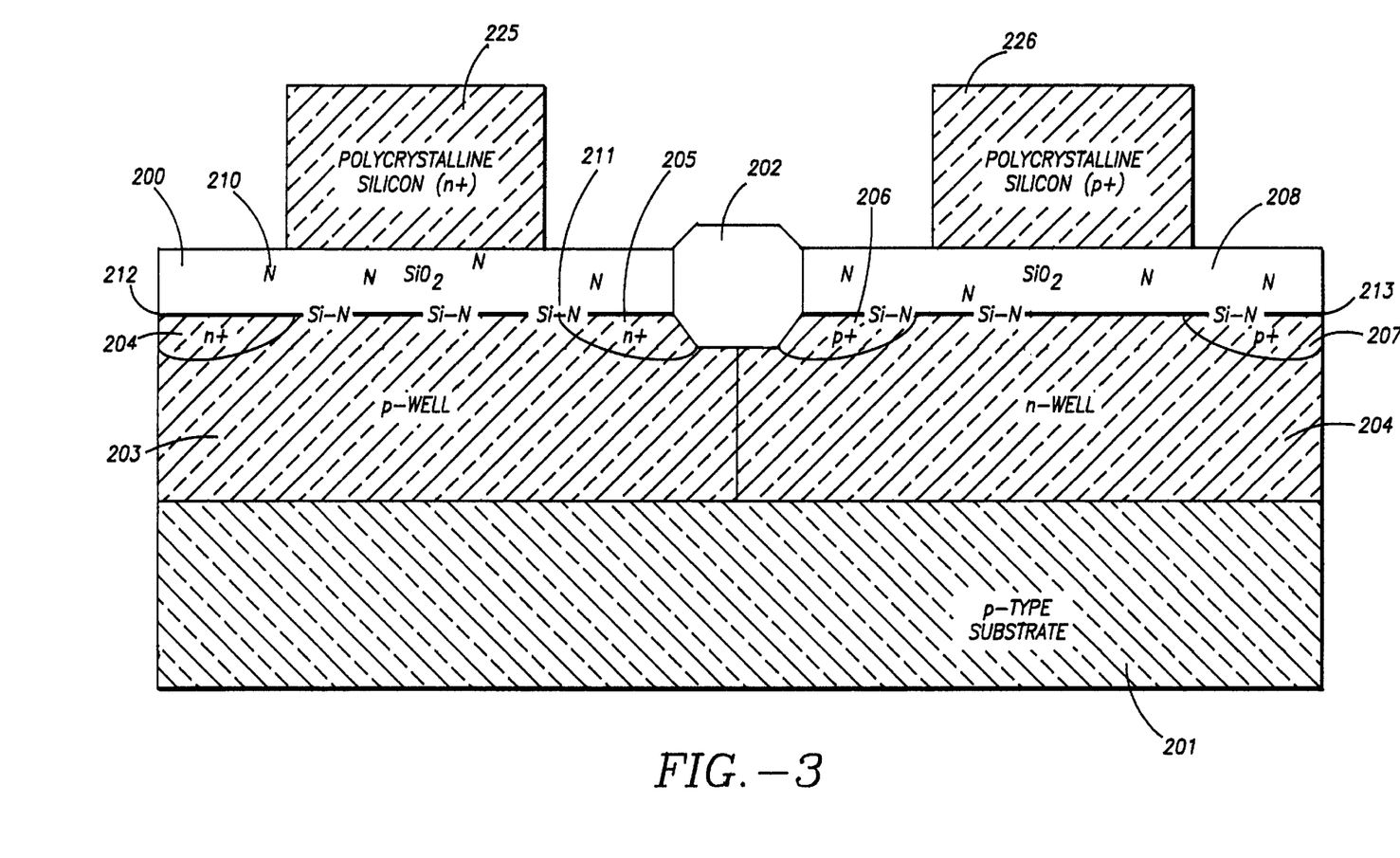
FIG. 3 is a simplified cross-section diagram of a dual-gate CMOS transistor having a dielectric layer manufactured according to the present invention.

The structure resulting from the process according to FIGS. 1 and 2 can be understood with respect to FIG. 3, in which a dual gate CMOS transistor structure is illustrated having a dielectric layer 200 formed according to the process of the present invention. Thus, the device is includes a silicon p-type substrate 201. The p-type substrate includes an isolation oxide 202 formed between a p-doped well 203 and a n-doped well 204. N-type source and drain regions 204 and 205 are formed in the p-well 203, and p-type source and drain regions 206 and 207 are formed in the n-well 204. A gate dielectric 200 is formed over the p-well, and a gate dielectric 208 is formed over the n-well using the process according to the present invention. Obviously the diagram is not drawn to scale. However, the diagram illustrates a layer of silicon dioxide according to the present invention having nitrogen atoms, e.g. atom 210, incorporated into the silicon dioxide as a result of the $N_2O$ oxidation. Furthermore, as a result of the NO anneal step, silicon-to-nitrogen bonds, e.g. bond 211, are formed in an interfacial region 212 between the silicon substrate 203 in the p-well and the silicon dioxide 200 over the p-well, and in an interfacial region 213 between the silicon substrate in the n-well 204, and the silicon dioxide 208 over the n-well. As mentioned above, the concentration of nitrogen incorporated into the silicon dioxide layers 200 and 208 is in the range of 0.1% to 0.7% and preferably between 0.4% and 0.6% by atomic weight. Also, the concentration of silicon-to-nitrogen bonds 211 in the interfacial regions 212 and 213 is in the range of 1% to 7% and preferably between 4% and 5% in a preferred system. However, lower or higher concentrations of silicon-to-nitrogen bonds 211 in the interfacial regions can be implemented, as well as lower or higher concentrations of nitrogen in the $SiO_2$ layers.

The concentrations of nitrogen incorporated into the silicon dioxide layer 200 can be controlled by controlling a mixture of gases utilized to grow the oxide. The $N_2O$ oxidation process can be carried out using a wide variety of process parameters as suits the particular implementation of the present invention. See for example S.C. Sun, et al. "Rapid Thermal Oxidation of Lightly Doped Silicon in $N_2O$", Vol. 342, MRS Symposia Proceedings (1994). For instance, $N_2O$ can be mixed with $O_2$ during the oxidation step to reduce the concentration of nitrogen in the structure and accelerate the oxide growth rate. Similarly, during the NO anneal step, a mixture of gas, such as NO and nitrogen can be used for the purpose of reducing the number of silicon-to-nitrogen bonds formed. Also, the length of time and the temperature of the NO anneal step can be controlled for managing the concentration of silicon-to-nitrogen bonds in the interfacial regions.

In a preferred system, the oxide layers are less than 12 nm thick. Preferably, such layers are in the range of 2.5 to 10 nm for the purposes of forming submicron scale devices having high quality dielectrics. The present invention is particularly suited to the growth of dielectrics in the range of 4 to 8 nm required for submicron devices.

FIG. 3 also illustrates use of the dielectric according to the present invention for the purposes of dual gate CMOS transistors having a n+ polysilicon gate 225 formed over the channel region in the p-well, and a p+ polysilicon gate 226 formed over the n-well. The p+ polysilicon gate 226 is typically doped using boron. This presents a problem of boron penetration for prior art dielectric layers. However, because of the unique process and structure provided by the present invention, boron penetration is substantially retarded. This makes sub-micron scale dual-gate CMOS devices practical.

The structure in FIG. 3 illustrates a dual gate CMOS structure. In addition to gate dielectrics in dual-gate CMOS transistors, the dielectric of the present invention can be used as a dielectric in for CMOS capacitors, and as a dielectric for other structures required in semiconductor device manufacturing.

Experimental verification of the superior results achieved by the present invention has been carried out, and FIGS. 4–10 illustrate the results of such experiment. For the purposes of generating the data illustrated in FIGS. 4–10, rapid thermal oxidation of lightly-doped (15–25 $\Omega$-cm), p-type and n-type (100) Si substrates was carried out in a load-locked AET Rapid Thermal Processor equipped with a cryo-pump for both the loading chamber and process chamber. Pressures were measured with dual MKS Baratron gauges which cover the range from 3 millitorr to 1000 torr. Pressures were maintained at a fixed flow rate with the use of a variable orifice butterfly valve in the process chamber exhaust manifold. The base pressure of the system was $1 \times 10^{-5}$ torr. Temperature monitoring was by pyrometer with calibration provided by a thermocouple wafer.

A pure $O_2$ grown wafer (control sample) received no nitridation anneal. A $N_2O$ sample (labeled as $N_2O$ oxide) was oxidized in pure $N_2O$ at 1050° C. All other oxynitride wafers were grown oxide first in either pure $N_2O$ (99.999%) or pure $O_2$ at 1050° C., then followed by an NO (99.9%) anneal at the same temperature for 60 seconds at atmospheric pressure (labeled as $N_2O$+NO oxide and $O_2$+NO oxide, respectively). Atmospheric pressure was used due to the extremely low growth rate in NO ambient. The initial oxidation time prior to NO-anneal was adjusted to obtain the same final oxide thickness of 65 Å. A last step of 950° C., 30 second anneal in $N_2$ was added in the MOS device fabrication. Prior to oxidation, the wafers were subjected to standard RCA cleaning (Werner Kern, RCA Review) and to a dip in 50:1 diluted HF before the final rinse in deionized water. Following oxidation, oxide thickness was measured on a well calibrated Rudolph Auto EL-III ellipsometer at a wavelength of 6328 Å with the refractive index set at 1.46. MOS capacitors of n+ poly and p+ poly on 4 inch (100) Si as well as CMOS devices using phosphorus-doped poly-Si as gate electrodes on 6 inch wafers were fabricated for electrical characterization.

Results and Discussion

Compared to growth in $N_2O$ ambient, results indicate that growth in NO is more self-limited. While oxidation of bare silicon in an $N_2O$ ambient at 1100° C. for 60 second produced 79 Å oxide layer, oxidation in NO under the same conditions produced only 33.5 Å of oxide. This is probably due to the higher amount of nitrogen incorporation in the $Si/SiO_2$ interface during NO oxidation compared to $N_2O$ oxidation. See, Okada, et al., IEEE Trans. Electron Devices, 41, 1608 (1994). The nitrogen rich silicon layer acts as a barrier to diffusion of the oxidant to the interface, thus hinders the oxidation process. Further evidence of retardation of growth rate is that at 1100° C., 180 seconds of NO oxidation produced only 38.6 Å of oxide (5.1 Å increment after extra 120 seconds oxidation time.)

Figure 4:
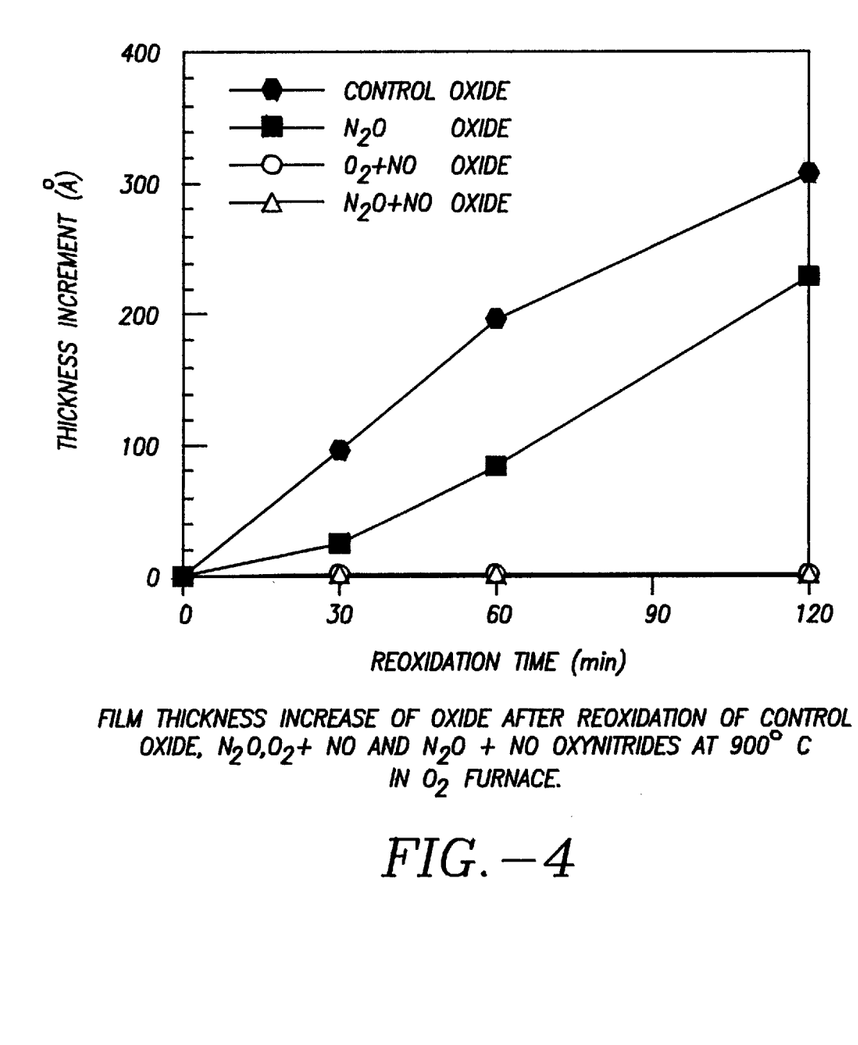
FIG. 4 is a graph illustrating results of a reoxidation experiment performed to characterize results of the present invention.

The qualitative evidence of nitrogen buildup at the interface is provided by a reoxidation experiment. As mentioned above, control oxides (pure $O_2$), $N_2O$ oxides, $O_2$-grown and NO-annealed ($O_2$+NO), as well as $N_2O$-grown and NO-annealed ($N_2O$+NO) oxynitrides samples were made having substantially the same oxide thickness of 65 Å. These samples were grown at 1050° C. by rapid thermal oxidation. These samples were put through reoxidation in a conventional furnace. FIG. 4 shows the thickness increase after 900° C. oxidation in pure $O_2$. As expected, the control sample has the largest amount of increase in thickness. Pure $N_2O$ sample has a smaller increase, but NO-annealed samples have less than 20 Å increase in oxide thickness even after 2 hours of reoxidation. The differences in thickness between $N_2O$+NO and $O_2$+NO oxynitrides are rather small. This indicates that the difference in nitrogen content at the Si–$SiO_2$ interface between $O_2$+NO oxide and $N_2O$+NO oxide is probably fairly small. One interesting phenomenon noted in FIG. 4 is that the reoxidation rate of $N_2O$ oxides has a small initial slope then gradually approaches that of control oxides, while the $N_2O$+NO and $O_2$+NO oxynitrides remains at very low growth rate. This result suggests that NO anneal has generated much higher nitrogen pile-up in the interface than that of $N_2O$ oxidation. This interpretation is also supported by the SIMS measurements of nitrogen concentrations in the oxynitride/Si interface. See, Harrison, et al., MRS Symposia Proceedings, 342, 151 (1994).

Figure 5:
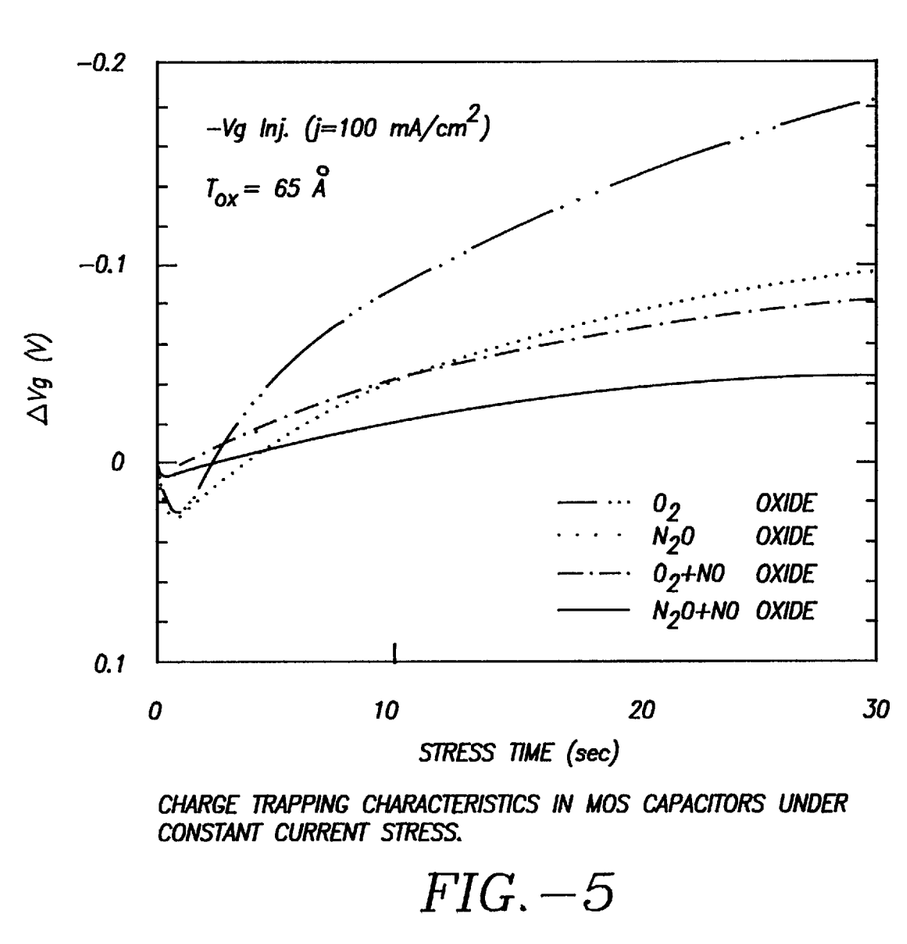
FIG. 5 is a graph illustrating charge trapping in MOS capacitors under constant current stress characterizing the present invention.

FIG. 5 shows charge trapping characteristics of control oxide, $N_2O$ oxynitride, and NO-annealed oxynitrides for gate injection. The gate voltage to maintain a constant current density of 100 mA/$cm^2$ was monitored. All samples show initial hole trapping followed by electron trapping. NO-annealed samples have smaller charge trapping rates. $N_2O$+NO oxynitride shows a lower trapping rate than that of $O_2$+NO oxynitride possibly due to the nitrogen incorporation inside the silicon dioxide during initial $N_2O$ oxidation and a higher degree of stress relief through slightly more nitrogen incorporation.

Figure 6:
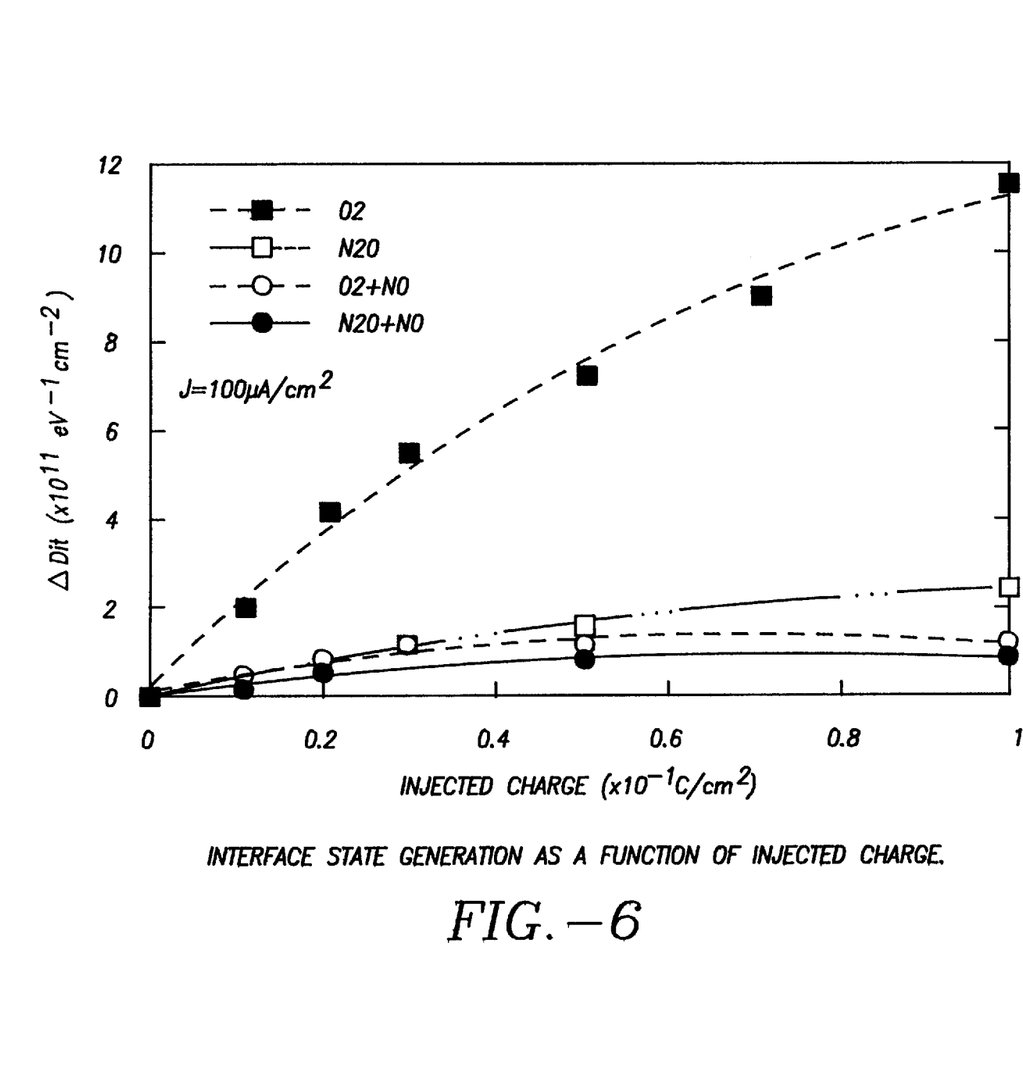
FIG. 6 is a graph illustrating interface state generation as a function of injected charge as a result of experiments performed to characterize the results of the present invention.

Both $N_2O$ and NO oxynitrides have shown excellent interface endurance under electrical stress compared to control oxide (FIG. 6). NO-based oxynitrides have the lowest interface state generation due to the high level of nitrogen at the $SiO_2$—Si interface, which reduces interfacial strain through the replacement of strained Si—O bonds by Si—N bonds and replacement of weak Si—H bonds by strong Si—N bonds, making bond-breaking under electrical stress less likely.

Figure 7A:
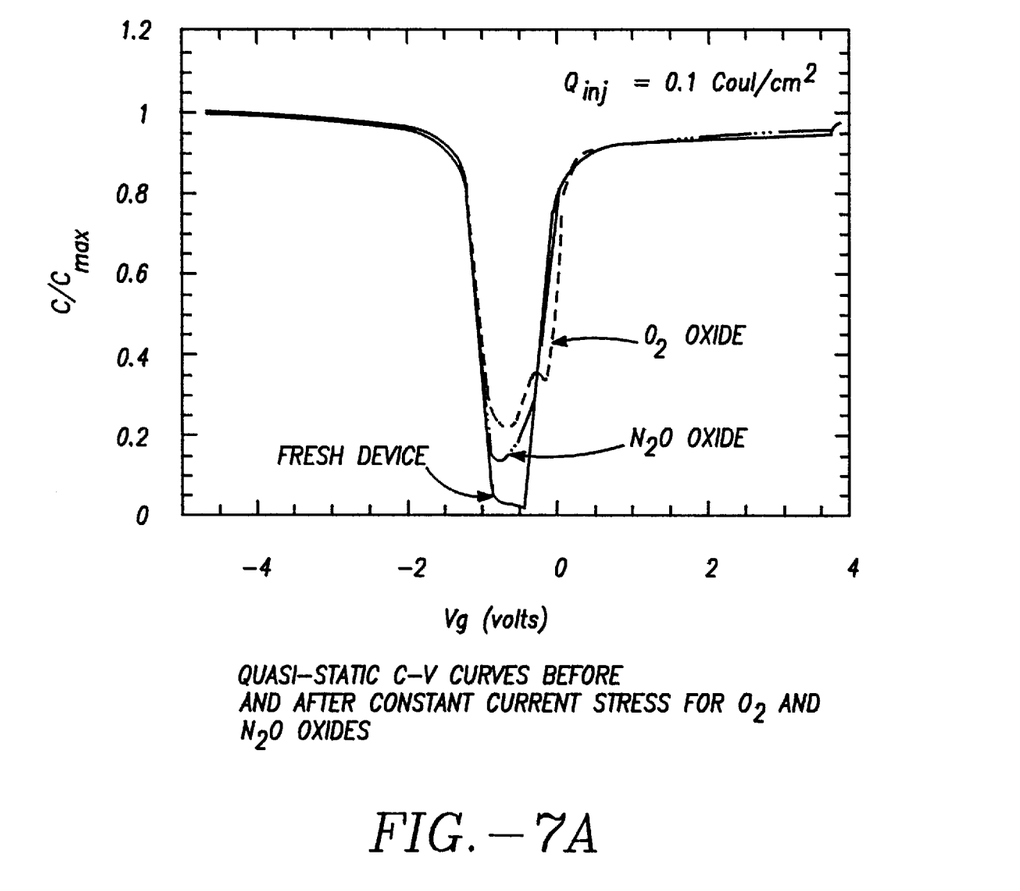
FIGS. 7(a) and 7(b) are quasi-static capacitance versus voltage curves for before and after constant current stress generated during experiments for the purpose of characterizing the results of the present invention.
Figure 7B:
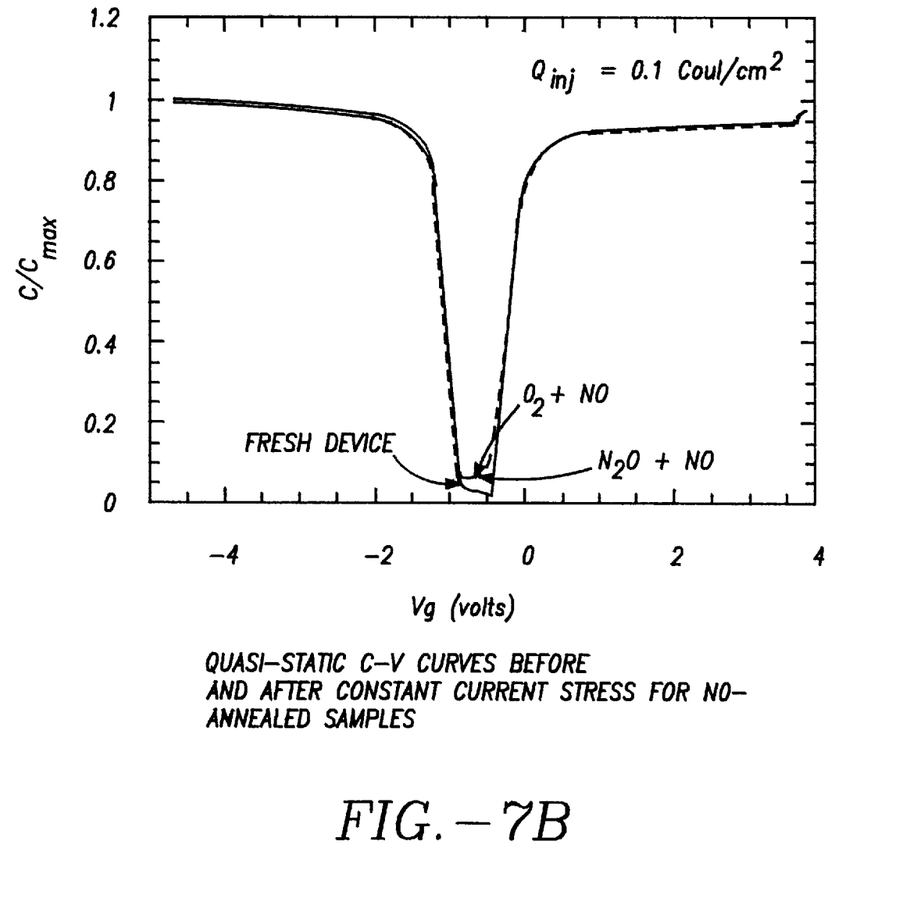

The quasi-static C-V characteristics after 0.1 coul/$cm^2$ fluence of current stress is shown in FIGS. 7(a) and 7(b). FIG. 7(a) shows the C-V curves of control $O_2$ oxides and $N_2O$ oxides after stress. The control sample has a large distortion which correlates with a large increase in interface state generation. Capacitors with NO-based oxynitrides (FIG. 7(b)) show the lowest amount of distortion as compared to $N_2O$ and control oxides.

Figure 8:
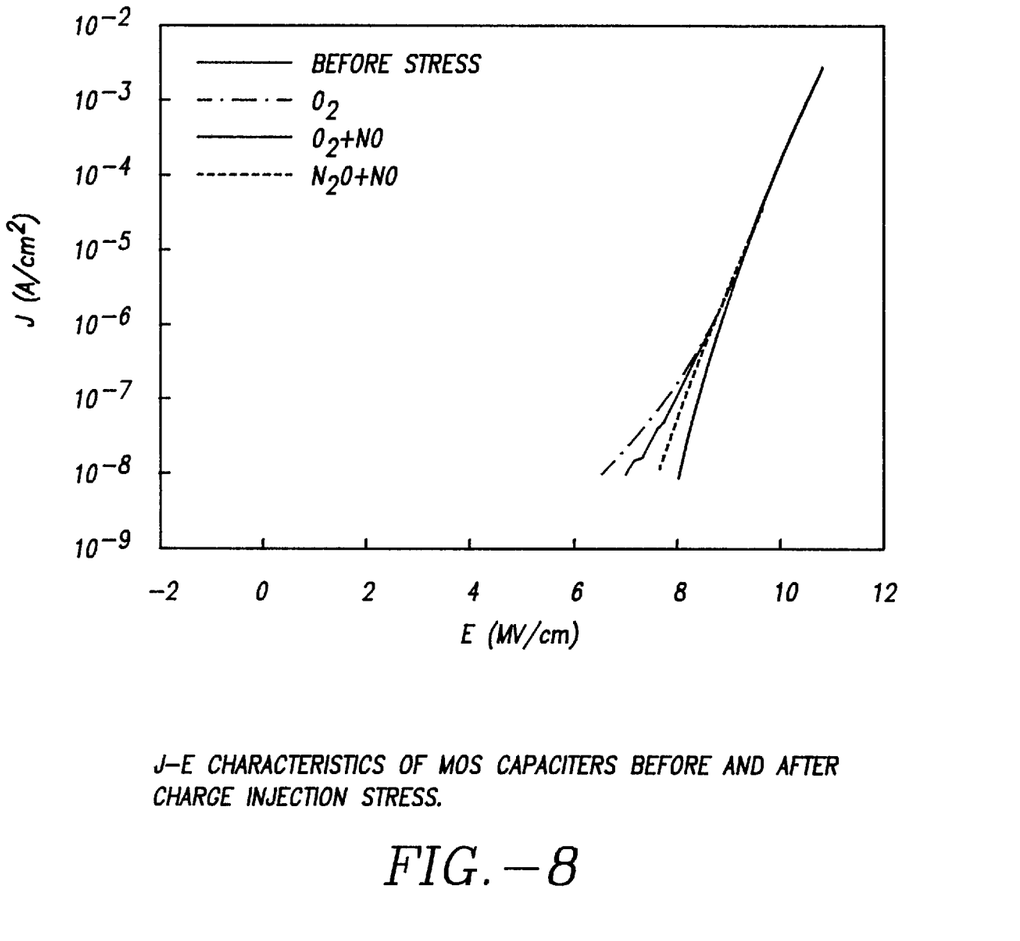
FIG. 8 is a graph of the leakage current density versus electric field characteristics of MOS capacitors before and after charge injection stress as the result of experiments done to characterize the present invention.
Figure 9:
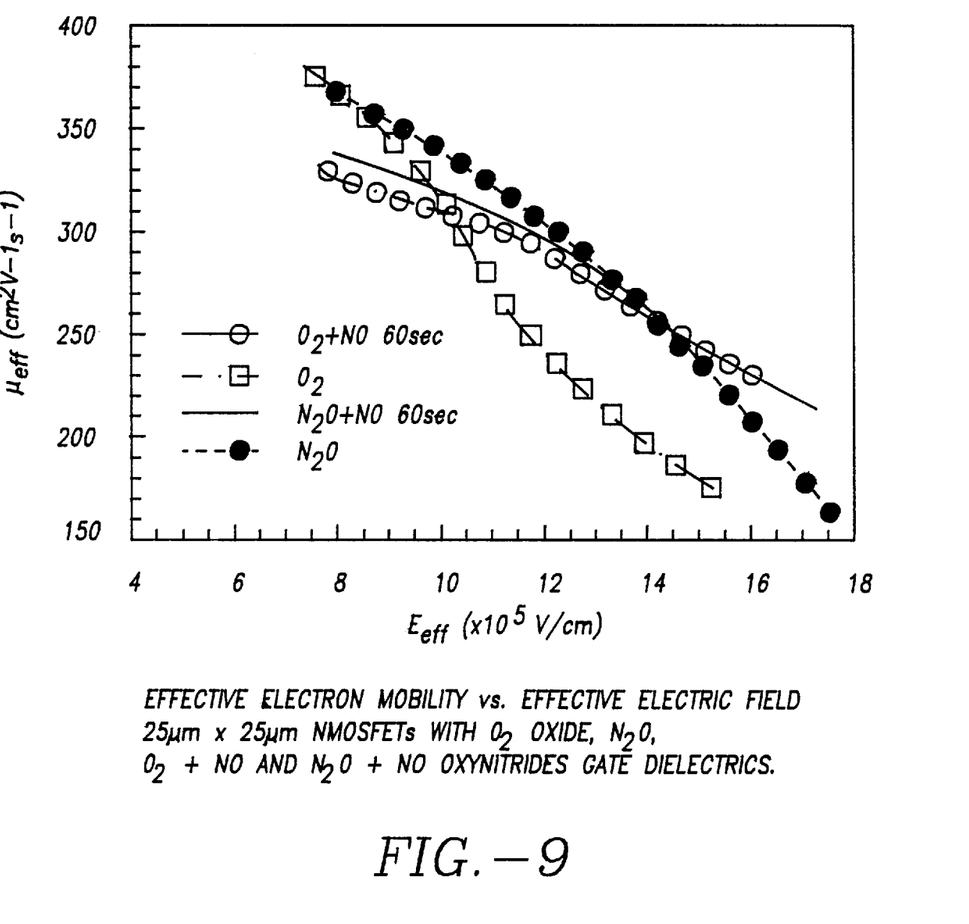
FIG. 9 is a graph illustrating effective electron mobility versus effective electric field for 25 micron by 25 micron n-type MOSFETs with $O_2$ oxide, and $N_2O$, $O_2$+NO and $N_2O$+NO oxynitrides as gate dielectrics for the purpose of characterizing results of the present invention.

Stress-induced leakage current (SILC) in thin oxide films can compromise the gate dielectric integrity of MOS devices especially in applications such as EEPROM's where it is expected to be the single most dominant factor limiting the tunnel oxide scaling. Bahr, et al., IEDM Tech. Dig., 329 (1994). FIG. 8 compares the leakage current before and after current stress for three different samples. It shows the excellent suppression of SILC in the $N_2O$+NO dielectrics.

Effective electron mobility was measured on NMOSFETs using W/L=25 μm/25 μm transistors. It is observed in FIG. 9 that electron mobility for the NO-annealed oxynitrides has a lower value than that of the control oxide at low fields and a higher value at high-field regimes. Low-field mobility of $N_2O$ oxynitride is almost the same as control oxide, but decreases more slowly with increasing electric field. High-field mobility is found to increase with increasing amount of nitridation, while low-field mobility degrades with more nitridation. This field dependence of mobility is speculated to be due to the increase in acceptor-like traps below the conduction band and reduction of interface states above the conduction band edge upon nitridation of oxide. See, Bahr, et al., IEDM Tech. Dig., 329 (1994) and Hori, IEEE Trans. Electron Devices, 37, 2058, (1990).

Figure 10:
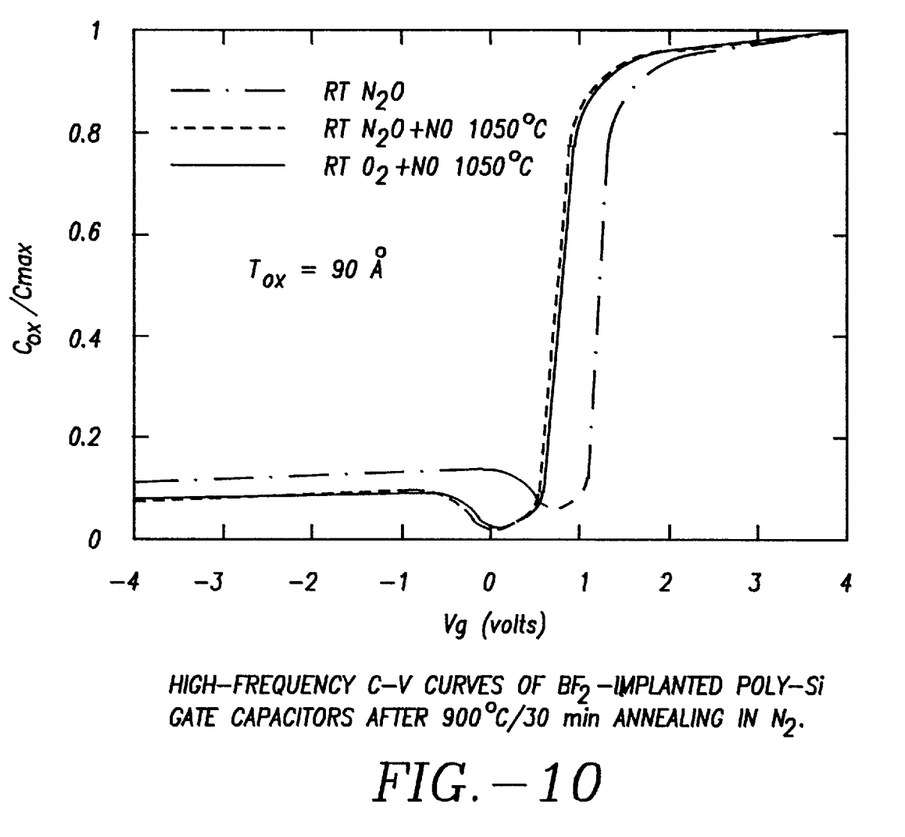
FIG. 10 is a graph illustrating the high frequency capacitance versus voltage curves for $BF_2$-implanted polysilicon gate capacitors after 900° C. annealing for 30 minutes in nitrogen gas for the purpose of characterizing the performance of the present invention.

Suppression of boron penetration in p+ poly MOS capacitors on n-type silicon substrate with $N_2O$- and NO- nitrided gate dielectrics is shown in FIG. 10 by normalized high frequency C-V curves. A p-type polysilicon gate was $BF_2$-implanted with a dose of $4\times10^{15}$ $cm^{-2}$ at an energy of 60 KeV. Capacitors were subjected to a thermal cycle of 900° C. for a 30 min anneal in $N_2$. As expected, the control oxide sample has the greatest flatband voltage shift (beyond 4 Volts of Vg measurement limit to the right) due to severe boron penetration. $N_2O$ oxide sample has a smaller shift to right, while NO-nitrided $SiO_2$ exhibits excellent immunity due to its excellent diffusion barrier properties. Therefore, NO-nitridation improves the process window for threshold voltage of p+ polysilicon gate PMOSFETs.

CONCLUSION

According to the present invention, gate oxynitride is grown in $N_2O$ and annealed in NO. Results indicate that NO-nitrided samples exhibit excellent reliability and immunity to boron penetration over $O_2$ and $N_2O$ samples. $N_2O$+NO samples have demonstrated advantages over $O_2$+NO sample probably due to a tighter nitrogen distribution in the oxynitride and a higher nitrogen accumulation at $SiO_2$-Si interface, making this technique very promising for deep-submicron dual-gate CMOS technology.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for manufacturing a dielectric layer on a silicon substrate, comprising:

first heating a surface of the silicon substrate and exposing the heated surface of the silicon substrate to a first gas, said first gas being introduced into a chamber and comprising $N_2O$, to cause growth of a layer of $SiO_2$ on the surface, said layer of $SiO_2$ including nitrogen; and second heating the layer of $SiO_2$ and exposing the heated layer of $SiO_2$ to a second gas, said second gas being introduced into the chamber and comprising NO, to cause formation of silicon to nitrogen bonds in an interfacial region between the layer of $SiO_2$ and the silicon substrate.

2. The method of claim 1, wherein the first gas consists essentially of $N_2O$.

3. The method of claim 1, wherein the second gas consists essentially of NO.

4. The method of claim 1, wherein first heating the surface of the silicon substrate and exposing the heated surface of the silicon substrate to the first gas includes:

placing the silicon substrate in a rapid thermal process chamber, filling the rapid thermal process chamber with the first gas, heating the surface of the silicon substrate to a first reaction temperature, and after a first reaction time, cooling the silicon substrate.

5. The method of claim 4, including after cooling the silicon substrate, removing the first gas from the rapid thermal process chamber, and wherein the second heating and exposing step includes:

filling the rapid thermal process chamber with the second gas, heating the layer to a second reaction temperature, and after a second reaction time, cooling the silicon substrate.

6. The method of claim 5, including after cooling the silicon substrate:

removing the second gas from the rapid thermal process chamber; and heating the layer and exposing the heated layer to an inert gas to anneal the layer and the interfacial region.

7. The method of claim 1, including after the second heating and exposing step:

third heating the layer and exposing the heated layer to an inert gas to anneal the layer and the interfacial region.

8. The method of claim 1, wherein the combination of the first and second heating and exposing steps result in a dielectric layer having a thickness of less than 12 nanometers.

9. The method of claim 1, wherein the combination of the first and second heating and exposing steps result in a dielectric layer having a thickness between 2.5 and 10 nanometers.

10. The method of claim 1, wherein the combination of the first and second heating and exposing steps result in a dielectric layer having a thickness between 4 and 8 nanometers.

11. The method of claim 1, wherein the combination of the first and second heating and exposing steps result in the nitrogen in the layer of $SiO_2$ having a concentration in a range of from 0.1% to 0.7% by atomic weight.

12. The method of claim 1, wherein the combination of the first and second heating and exposing steps result in the nitrogen in the interfacial region having a concentration in a range of from 1% to 7% by atomic weight.

13. The method of claim 1, wherein the first reaction temperature is in a range of about 900° and 1200° C.

14. The method of claim 1, wherein the second reaction temperature is in a range of about 900° and 1200° C.

15. A method for in situ rapid thermal growth of a nitrided $SiO_2$ layer on a silicon substrate, comprising:

placing the silicon substrate in a rapid thermal process chamber, introducing a first gas into the process chambers, said first gas comprising $N_2O$, heating the surface of the silicon substrate to a first reaction temperature to cause growth of a layer of $SiO_2$ on the surface, said layer of $SiO_2$ including nitrogen, and after a first reaction time, cooling the silicon substrate;

removing the first gas from the process chamber, introducing a second gas into the process chamber, said second gas comprising NO, heating the layer of $SiO_2$ to a second reaction temperature to cause formation of silicon to nitrogen bonds in an interfacial region between the layer of $SiO_2$ and the silicon substrate, and after a second reaction time, cooling the silicon substrate; and removing the second gas from the reaction chamber, filing the process chamber with an inert gas, and heating the layer to anneal the layer of $SiO_2$ and the interfacial region.

16. The method of claim 15, wherein the first gas consists essentially of $N_2O$.

17. The method of claim 15, wherein the second gas consists essentially of NO.

18. The method of claim 15, wherein the nitrided $SiO_2$ layer has a thickness of less than 12 nanometers.

19. The method of claim 15, wherein the nitrided $SiO_2$ layer has a thickness between 2.5 and 10 nanometers.

20. The method of claim 15, wherein the nitrided $SiO_2$ layer has a thickness between 4 and 8 nanometers.

21. The method of claim 15, wherein the nitrided $SiO_2$ layer has nitrogen in the layer of $SiO_2$ in a concentration in a range of from 0.1% to 0.7% by atomic weight.

22. The method of claim 15, wherein the nitrided $SiO_2$ layer has nitrogen in the interfacial region having a concentration in a range of from 1% to 7% by atomic weight.

23. The method of claim 15, wherein the first reaction temperature is between about 900° and 1200° C.

24. The method of claim 15, wherein the second reaction temperature is between about 900° and 1200° C.

25. The method of claim 15, wherein the first reaction time is between 15 and 90 seconds.

26. The method of claim 15, wherein the second reaction time is between 15 and 90 seconds.

* * * * *